(12) United States Patent
Shioya et al.

(10) Patent No.: US 6,815,824 B2
(45) Date of Patent: Nov. 9, 2004

(54) SEMICONDUCTOR DEVICE AND METHOD OF MANUFACTURING THE SAME

(75) Inventors: Yoshimi Shioya, Tokyo (JP); Yuhko Nishimoto, Tokyo (JP); Kazuo Maeda, Tokyo (JP); Tomomi Suzuki, Tokyo (JP); Hiroshi Ikakura, Tokyo (JP)

(73) Assignees: Canon Sales Co., Inc. (JP); Semiconductor Process Laboratory Co. Ld. (JP)

( * ) Notice: Subject to any disclaimer, the term of this patent is extended or adjusted under 35 U.S.C. 154(b) by 0 days.

(21) Appl. No.: 10/176,588

(22) Filed: Jun. 24, 2002

(65) Prior Publication Data

US 2003/0042613 A1 Mar. 6, 2003

(30) Foreign Application Priority Data

Aug. 17, 2001 (JP) .......................................... 2001-247936

(51) Int. Cl.[7] .............................................. H01L 23/485
(52) U.S. Cl. ......................................................... 257/760
(58) Field of Search ................................. 257/751, 758, 257/759, 760, 767, 774; 438/627

(56) References Cited

U.S. PATENT DOCUMENTS

| | | | |
|---|---|---|---|
| 5,040,046 A | 8/1991 | Chhabra et al. ............... 357/54 |
| 5,314,724 A | 5/1994 | Tsukune et al. ............ 427/489 |
| 5,593,741 A | 1/1997 | Ikeda ........................ 427/579 |
| 6,287,990 B1 | 9/2001 | Cheung et al. ............. 438/780 |
| 6,337,518 B1 | * 1/2002 | Grill et al. .................. 257/758 |
| 6,417,092 B1 | * 7/2002 | Jain et al. ................... 438/624 |
| 6,497,963 B1 | * 12/2002 | Grill et al. .................. 428/446 |
| 2002/0172811 A1 | * 11/2002 | Barth et al. ................. 428/209 |

FOREIGN PATENT DOCUMENTS

| | | |
|---|---|---|
| EP | 0 720 233 A1 | 12/1994 |
| EP | 0 960 958 A2 | 5/1999 |
| EP | 1 122 773 A2 | 4/2000 |
| EP | 1 158 577 A2 | 5/2001 |

OTHER PUBLICATIONS

Development of Low–k Copper Barrier Films Deposited by PE–CVD using HMDSO, N2O and NH3 Shioya et al, 2001.
Device Electronics for Integrated Circuits, pp. 102–103.
Properties and Integration of Low k (k<3.0) PECVD films.

* cited by examiner

Primary Examiner—Erik J. Kielin
Assistant Examiner—Jennifer M. Dolan
(74) Attorney, Agent, or Firm—Lorusso, Loud & Kelly

(57) ABSTRACT

The present invention relates to a semiconductor device in which a barrier insulating film is formed to cover a copper film or a wiring consisting mainly of the copper film. The barrier insulating film is a structure of two or more layers including at least a first barrier insulating film containing silicon, oxygen, nitrogen and hydrogen or silicon, oxygen, nitrogen, hydrogen and carbon, and a second barrier insulating film containing silicon, oxygen and hydrogen or silicon, oxygen, hydrogen and carbon.

1 Claim, 10 Drawing Sheets

SEMICONDUCTOR DEVICE AND METHOD OF MANUFACTURING THE SAME

CROSS-REFERENCE TO RELATED APPLICATION

The present application claims priority of Japanese Application No. 2001-247936 filed Aug. 17, 2001.

BACKGROUND OF THE INVENTION

1. Field of the Invention

The present invention relates to a semiconductor device in which a barrier insulating film is formed over wiring of a copper film or mainly copper film on a substrate, and a method of manufacturing the same.

2. Description of the Prior Art

In recent years, not only a higher degree of integration of semiconductor integrated circuit devices, but also a higher data transfer rate has been demanded. For this reason, there is a need for a barrier insulating film for wiring of copper film or mainly copper film, which has a copper diffusion preventing capability and a low relative dielectric constant.

As the barrier insulating film, either a silicon oxide film formed by a plasma CVD method using a film-forming gas that contains tetramethylsilane ($SiH(CH_3)_4$) and $CH_4$ or a silicon nitride film formed by the plasma CVD method is employed.

However, there is the problem with the silicon oxide film, that while the relative dielectric constant is low, it contains a large amount of carbon and thus it is difficult to sufficiently suppress the leakage current. Also, there is the problem that the copper diffusion preventing capability of the silicon oxide film is not sufficient. In contrast, there is the problem with a silicon nitride that, while the leakage current is low and the diffusion preventing capability with respect to the copper is sufficiently high, the relative dielectric constant is large.

SUMMARY OF THE INVENTION

It is an object of the present invention to provide a semiconductor device having a barrier insulating film which covers the wiring made of copper film or mainly copper film, whose leakage current is low, whose copper diffusion preventing capability is sufficiently high, and whose relative dielectric constant is small, and a method of manufacturing the same.

An insulating film that contains silicon, oxygen, nitrogen, and hydrogen or silicon, oxygen, nitrogen, hydrogen, and carbon is dense, its leakage current is low, and its copper diffusion preventing capability is sufficiently high, but its relative dielectric constant is higher because of its nitrogen content. Also, the selective etching ratio of the insulating film to the $SiO_2$ film formed by the plasma CVD method is large. In contrast, in an insulating film that contains either silicon, oxygen, and hydrogen or silicon, oxygen, hydrogen, and carbon, the relative dielectric constant is lower, but the denseness is relatively lower and thus the leakage current is large. Also, such an insulating film has insufficient copper diffusion preventing capability.

In the present invention, the barrier insulating film for covering the wiring made of copper film or mainly of copper film has a two or more layered structure including at least a first barrier insulating film and a second barrier insulating film. The first barrier insulating film contains either silicon, oxygen, nitrogen, and hydrogen or silicon, oxygen, nitrogen, hydrogen, and carbon. The second barrier insulating film contains silicon, oxygen, and hydrogen or silicon, oxygen, hydrogen, and carbon. Either the first barrier insulating film or the second barrier insulating film may be formed as the layer that comes into contact with the wiring of the copper film or mainly copper film.

More particularly, in order not to adversely affect low leakage current and the high diffusion preventing capability with respect to the copper, the first barrier insulating film that has the relatively high relative dielectric constant is made thin, while the second barrier insulating film that has the low relative dielectric constant is made sufficiently thick to provide the overall film thickness necessary for the barrier insulating film. As a result, the barrier insulating film composed of at least the first barrier insulating film and the second barrier insulating film together provide a relatively low dielectric constant, a low leakage current, and a sufficiently high copper diffusion preventing capability.

A first barrier insulating film containing silicon, oxygen, nitrogen, and hydrogen can be formed by plasmanizing a first film-forming gas containing silane ($SiH_4$), at least one of $N_2O$ and $H_2O$, and at least one of $N_2$ and $NH_3$ for reaction. Also, a first barrier insulating film that contains silicon, oxygen, nitrogen, hydrogen, and carbon can be formed by plasmanizing a first film-forming gas containing at least one of siloxane and methylsilane ($SiH_n(CH_3)_{4-n}$:n=0, 1, 2, 3), at least one of $N_2O$, $H_2O$ and $CO_2$, and at least one of $N_2$ and $NH_3$ to react.

A second barrier insulating film which contains silicon, oxygen, and hydrogen can be formed by plasmanizing a second film-forming gas containing silane and at least one of $N_2O$ and $H_2O$ for reaction. A second barrier insulating film which contains silicon, oxygen, hydrogen, and carbon can be formed by plasmanizing a second film-forming gas containing at least one of siloxane and methylsilane ($SiH_n(CH_3)_{4-n}$:n=0, 1, 2, 3), and at least one of $N_2O$, $H_2O$ and $CO_2$ for reaction.

In addition, an insulating film having a low dielectric constant may be further formed on the above barrier insulating film. In this case, the barrier insulating film and the insulating film having the low dielectric constant may be employed as the interlayer insulating film by forming new wiring made of a copper film or mainly copper film on the insulating film having the low dielectric constant.

DESCRIPTION OF THE PREFERRED EMBODIMENTS

Embodiments of the present invention will now be explained with reference to the accompanying drawings.

First Embodiment

Figure 1:
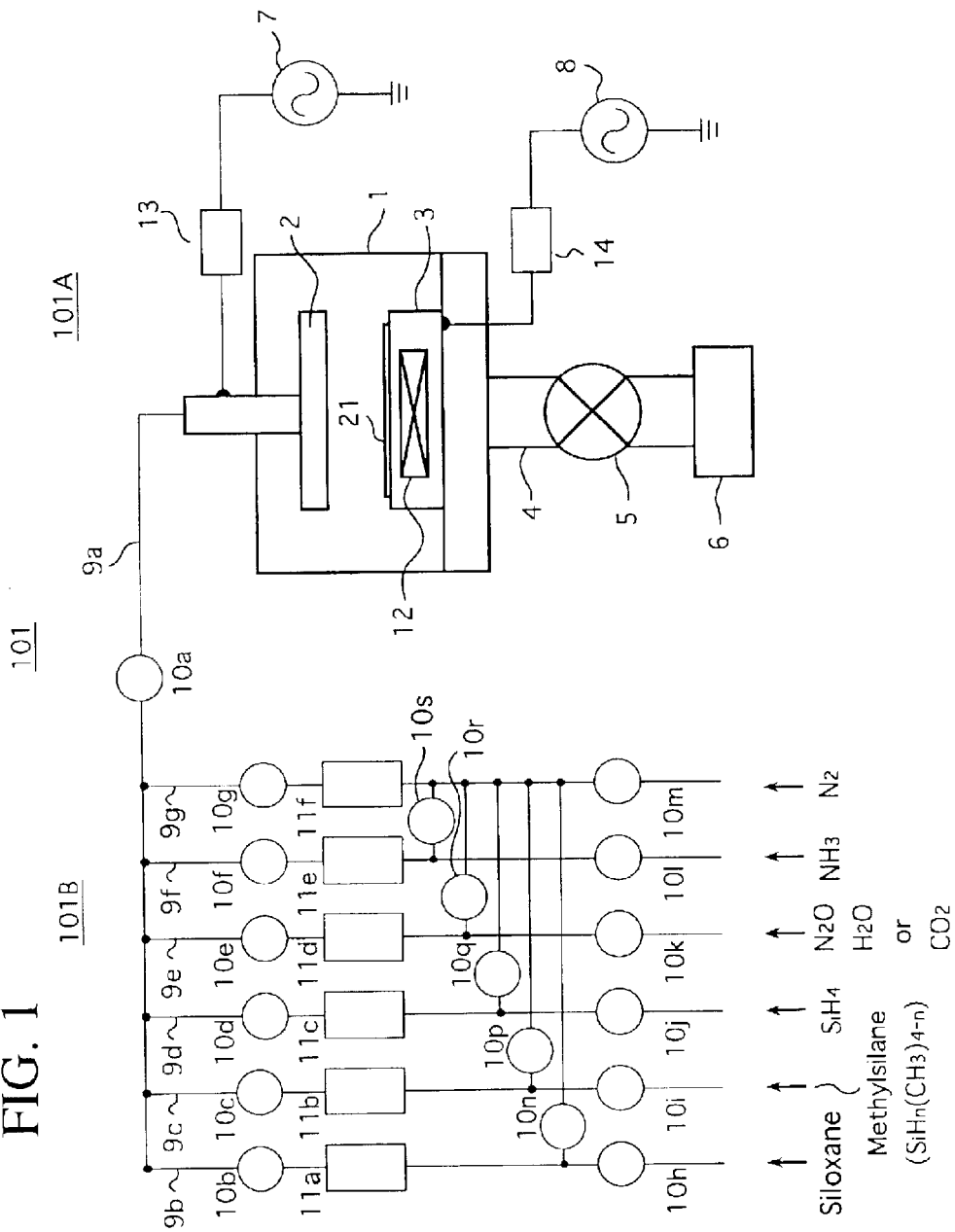
FIG. 1 is a schematic view of a plasma enhanced film-forming apparatus employed in manufacturing embodiments of the present invention.

FIG. 1 is a side view showing a configuration of a parallel plate type plasma enhanced film-forming apparatus 101 employed in manufacturing embodiments of the present invention.

This plasma enhanced film-forming apparatus 101 consists of a film-forming portion 101A wherein an insulating film is formed on a substrate 21 by the plasma gas, and a film-forming gas supply portion 101B having a plurality of gas supply sources for the film-forming gas.

As shown in FIG. 1, the film-forming portion 101A is equipped with a chamber 1 being capable of holding a vacuum. The chamber 1 is connected to an exhaust unit 6 via an exhaust pipe 4. A switching valve 5, for controlling flow from the chamber 1 to the exhaust unit 6, is provided in the middle of the exhaust pipe 4. A pressure measuring means such as a vacuum gauge (not shown), or the like, is provided for monitoring the pressure in the chamber 1.

An upper electrode 2 and a lower electrode 3 are paired in the chamber 1 in opposition to each other. A high frequency power supply (RF power supply) 7 for supplying high frequency power at a frequency of 13.56 MHz is connected to the upper electrode 2. A low frequency power supply 8 for supplying low frequency power at a frequency of 380 kHz is connected to the lower electrode 3. The film-forming gas is plasmanized by power from these power supplies 7, 8 applied to the upper electrode 2 and the lower electrode 3. The upper electrode 2, the lower electrode 3, and the power supplies 7, 8 constitute a plasma generating means for plasmanizing the film-forming gas.

The upper electrode 2 is also used as the distributor for the film-forming gas. A plurality of through holes formed in the upper electrode 2 opposing the lower electrode 3 serve as discharge ports for the film-forming gas. The discharge ports are connected to the film-forming gas supplying portion 101B via a pipe 9a. Also, a heater (not shown) may be provided for the upper electrode 2. By heating the upper electrode 2 to a temperature of about 100° C. during film formation, particles of the reaction product of the film-forming gas, etc. can be prevented from adhering to the upper electrode 2.

The lower electrode 3 is also used as a loading table for the substrate 21 and is equipped with a heater 12 for heating the substrate 21 on the loading table.

A siloxane supply source, a methylsilane ($SiH_n(CH_3)_{4-n}$: n=0, 1, 2, 3) supply source, a silane ($SiH_4$) supply source, a supply source of $N_2O$, $H_2O$ or $CO_2$ as the oxygen-containing gas, an ammonia ($NH_3$) supply source, and a nitrogen ($N_2$) supply source are provided in the film-forming gas supplying portion 101B.

These gases are supplied appropriately to the interior of the chamber 1 of the film-forming portion 101A via branch pipes 9b to 9g and the pipe 9a to which all branch pipes 9b to 9g are connected. Flow rate adjusting means 11a to 11f and switching means 10b to 10m for opening/closing the branch pipes 9b to 9g are provided in the middle of the branch pipes 9b to 9g. A switching means 10a for opening/closing the pipe 9a is provided in the middle of the pipe 9a.

In order to purge the residual gas from the branch pipes 9b to 9g with a flow of $N_2$ gas, switching means 10n, exemplified by 10p to 10s, are provided for controlling the communication between the branch pipe 9g, which is connected to the $N_2$ gas supply source, and remaining branch pipes 9b to 9f. Accordingly, $N_2$ gas can purge the residual gas in the pipe 9a and the chamber 1 in addition to the branch pipes 9b to 9f. The $N_2$ gas is also employed as a diluent gas.

As shown by the following embodiment, the first barrier insulating film having a low dielectric constant and the second barrier insulating film having the high copper diffusion preventing capability and low leakage current can be formed by the plasma enhanced CVD method. The first barrier insulating film contains silicon (Si), oxygen (O) and hydrogen (H), or Si, O, H and carbon (C). The second barrier insulating film contains Si, O, H, and nitrogen (N) or Si, O, H, N and C.

The plasma generating means including the upper electrode 2 and the lower electrode 3 of the parallel plate type can produce an insulating film which is dense and has a low dielectric constant.

High frequency power of more than 1 MHz may be applied to the upper electrode 2, while low frequency power of more than 100 kHz but less than 1 MHz is applied to the lower electrode 3. Alternatively, no low frequency power is applied to the lower electrode 3, while the high frequency power of more than 1 MHz is applied to the upper electrode 2. Alternatively, no high frequency power is applied to the upper electrode 2, while low frequency power is applied to the lower electrode 3.

Examples of the siloxane, methylsilane, and oxygen-containing gas used as the film-forming gas in the present invention, include the following typical examples:

(i) siloxane hexamethyldisiloxane (HMDSO:$(CH_3)_3Si$—O—$Si(CH_3)_3$)

octamethylcyclotetrasiloxane (OMCTS:$((CH_3)_2)_4Si_4O_4$ (Chemical formula 7))

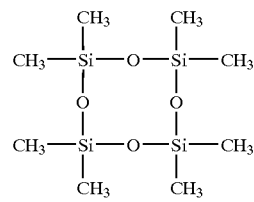

tetramethylcyclotetrasiloxane (TMCTS:$(CH_3H)_4Si_4O_4$ (Chemical formula 8))

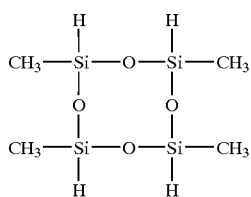

(ii) methylsilane ($SiH_n(CH_3)_{4-n}$: n=0, 1, 2, 3)
monomethylsilane ($SiH_3(CH_3)$)
dimethylsilane ($SiH_2(CH_3)_2$)
trimethylsilane ($SiH(CH_3)_3$)
tetramethylsilane ($Si(CH_3)_4$)
(iii) oxygen-containing gas
nitrogen monoxide ($N_2O$)
water ($H_2O$)
carbon dioxide ($CO_2$)

Experimental

Samples were prepared by plasma enhanced surface treatment prior to the film formation, followed by the film formation and annealing. The plasma enhanced surface treatment conditions, the film-forming conditions, and the annealing conditions are given as follows.

By employing film-forming conditions 1, 1a described in the following, the first barrier insulating film containing Si, O, H and C is formed on the Si substrate and the copper film by the plasma-enhanced CVD method (PECVD method). Also, according to film-forming conditions 2 described in the following, the second barrier insulating film containing Si, O, H, N and C is formed on the Si substrate and the copper film by the plasma-enhanced CVD method (PECVD method).

The time (stabilization period) required for the substitution of the gas in the chamber from the introduction of the gas to the start of the film formation (plasma excitation) is set to one minute and 30 seconds in the film formation. Also, in order to prevent the adhesion of the reaction product on the upper electrode 2, this upper electrode 2 is heated to 100° C. during this period.

Figure 2:
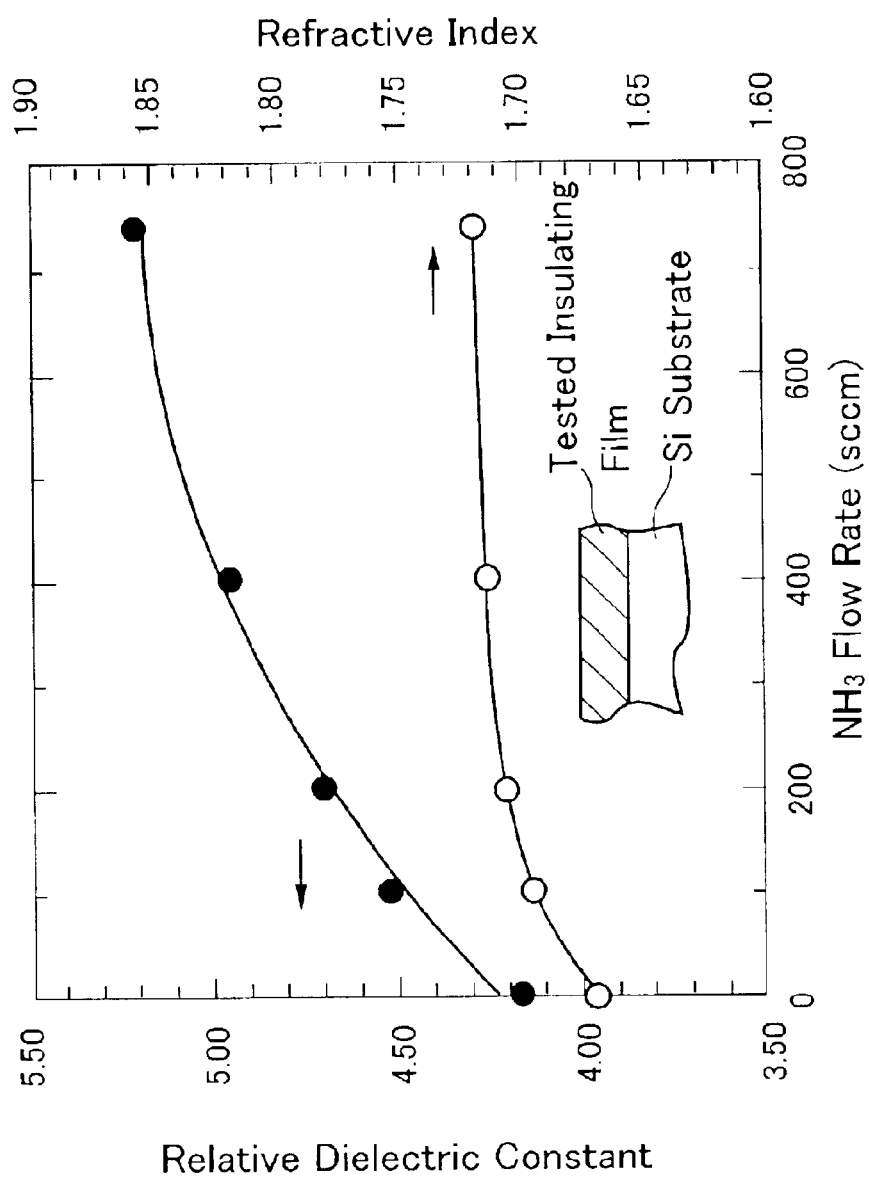
FIG. 2 is a graph of relative dielectric constant and a refractive index versus $NH_3$ flow rate in a film-forming gas for forming a first barrier insulating film according to a first embodiment of the present invention.

First, test conditions for the first barrier insulating film (the tested insulating film) were as follows:
 (i) Plasma enhanced surface treatment conditions:
  (a) Process gas
   $NH_3$ flow rate: 400 sccm
   Gas pressure (parameter): 4 Torr
  (b) Plasma exciting conditions
   Lower electrode: low frequency power
    (frequency 380 kHz)=0 W
   Upper electrode: high frequency power
    (frequency 13.56 MHz)=400 W (0.963 W/cm$^2$)
  (c) Substrate heating condition: 375° C.
 (ii) Film-forming conditions 1:
  (a) First film-forming gas
   HMDSO flow rate: 50 sccm
   $N_2O$ flow rate: 200 sccm
   $NH_3$ flow rate (parameter): 0, 50, 100, 200, 400, 600, 750 sccm
   Gas pressure (parameter): 1 Torr
  (b) Plasma exciting conditions
   Lower electrode: low frequency power
    (frequency 380 kHz)=150 W (0.36 W/cm$^2$)
   Upper electrode: high frequency power
    (frequency 13.56 MHz)=0 W
  (c) Substrate heating condition: 375° C.
 (iii) Annealing conditions:
  (a) Substrate heating condition: 450° C.
  (b) Time: 4 hours (a) The Relative Dielectric Constant and the Refractive Index of the Tested Insulating Film FIG. 2 is a graph showing the relative dielectric constant and the refractive index of the film formed on the Si substrate versus the $NH_3$ flow rate of the first film-forming gas. The ordinate on the left side denotes the relative dielectric constant of the tested insulating film on a linear scale, the ordinate on the right side denotes the refractive index of the tested insulating film on a linear scale, and the abscissa denotes the $NH_3$ flow rate (sccm) of the first film-forming gas in a linear scale.

The insulating film to be tested was formed on the Si substrate with seven different $NH_3$ flow rates for the first film-forming gas, 0, 50, 100, 200, 400, 600, 750 sccm respectively, without the application of high frequency power to the upper electrode 2. The relative dielectric constant was measured as follows. That is, a mercury probe was brought into contact with a surface of the insulating film to be tested, then a DC bias voltage was applied between the mercury probe and the Si substrate, and then a signal voltage at a frequency of 1 MHz was superimposed, to obtain a C-V measurement. The measured relative dielectric constant is indicated by a ● mark in FIG. 2. Also, the refractive index was measured by an ellipsometer using a He—Ne laser having a wavelength of 6338 Angstroms. The measured refractive index is indicated by a ○ mark in FIG. 2.

Figure 7:
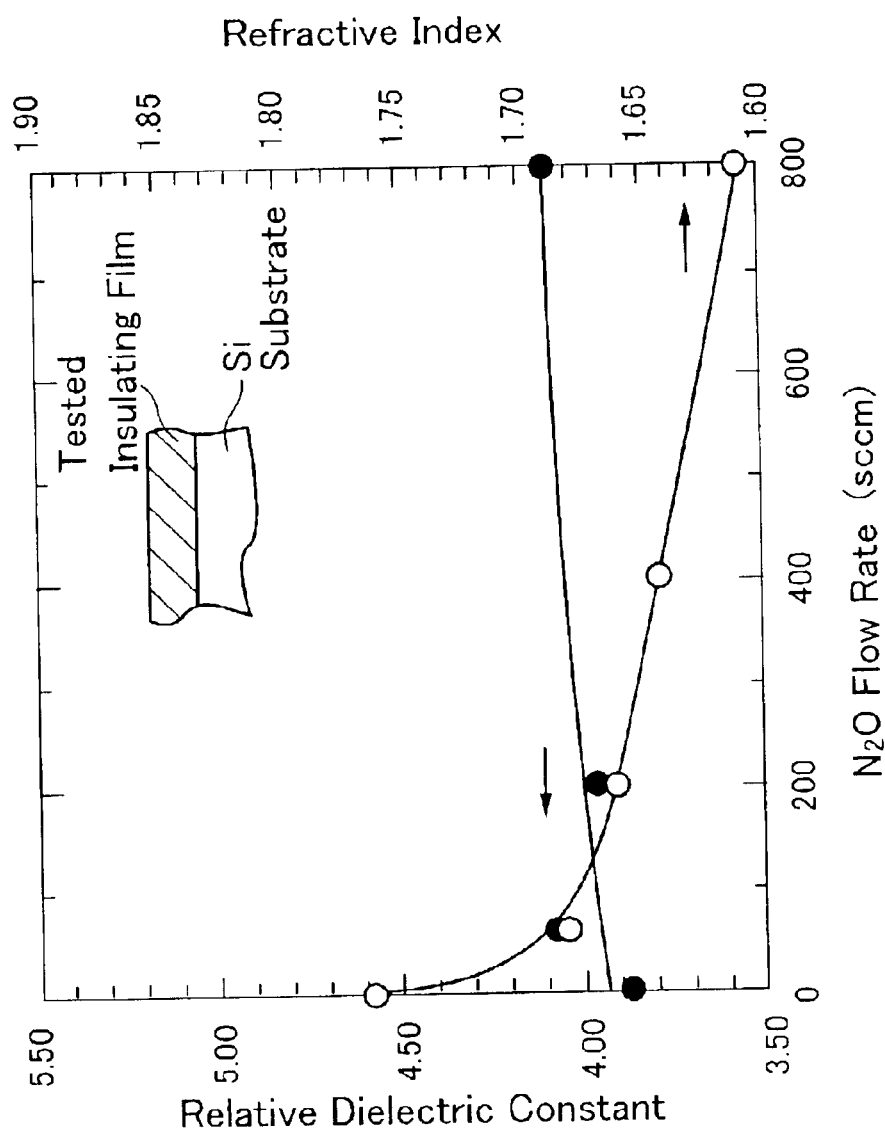
FIG. 7 is a graph of the relative dielectric constant and the refractive index versus $N_2O$ flow rate of the film-forming gas for a second barrier insulating film according to the first embodiment of the present invention.

As shown in FIG. 2, the relative dielectric constant increased with increase of the $NH_3$ flow rate. The relative dielectric constant, that was about 4.2 when the $NH_3$ flow rate was 0 sccm, became about 5.2 when the $NH_3$ flow rate increased to 750 sccm. The relative dielectric constant was higher than that of the tested insulating film, described later and is shown in FIG. 7, and does not contain nitrogen.

The refractive index gradually increased with increase of the $NH_3$ flow rate. The refractive index, that was about 1.67 when the $NH_3$ flow rate was 0 sccm, became about 1.72 when the $NH_3$ flow rate increased to 750 sccm. The refractive index became higher in contrast to the tested insulating film that is shown in FIG. 7 and does not contain nitrogen (equivalent to the case where the $NH_3$ flow rate is 0 sccm). The fact that the refractive index is higher directly indicates that the film is denser.

(b) The Leakage Current of the Tested Insulating Film

Figure 3:
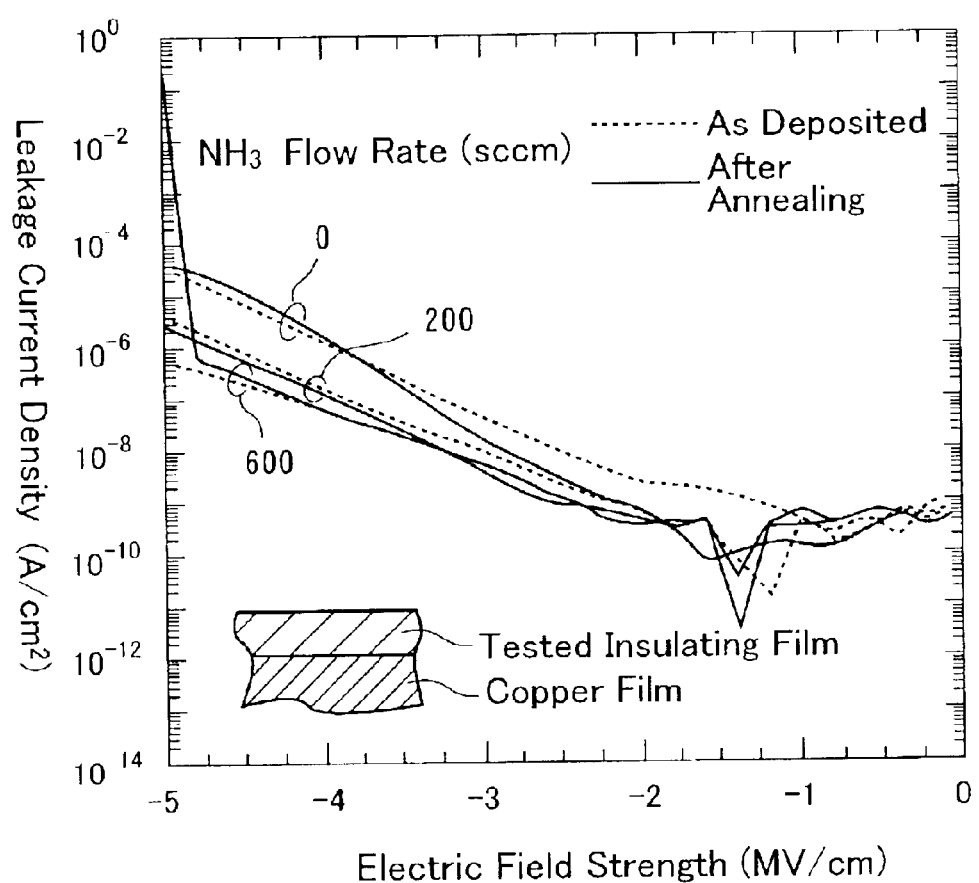
FIG. 3 is a graph of leakage current density versus electric field strength for a first barrier insulating film according to a first embodiment of the present invention.

FIG. 3 is a graph showing the relationship between the electric field strength applied to the tested insulating film and the leakage current density of the tested insulating film, before and after annealing. The ordinate denotes the leakage current density (A/cm$^2$) of the tested insulating film on a linear scale, and the abscissa denotes the electric field strength (MV/cm) on a linear scale. The $NH_3$ flow rates of 0, 200, and 600 sccm of the first film-forming gas were used as the variable parameter.

The tested insulating film was formed on a copper film. The copper film was grounded immediately after the film formation but before the annealing and after the annealing, and then the mercury probe was brought into contact with the surface of the insulating film to be tested. Then, the leakage current was measured by applying a negative voltage to the mercury probe, and the leakage current density was calculated based on the area of the mercury probe. The electric field strength (abscissa) is the electric field strength obtained based on the negative voltage at that time. A minus sign for the electric field strength signifies that the electric field was directed from the copper film to the mercury probe.

Figure 5:
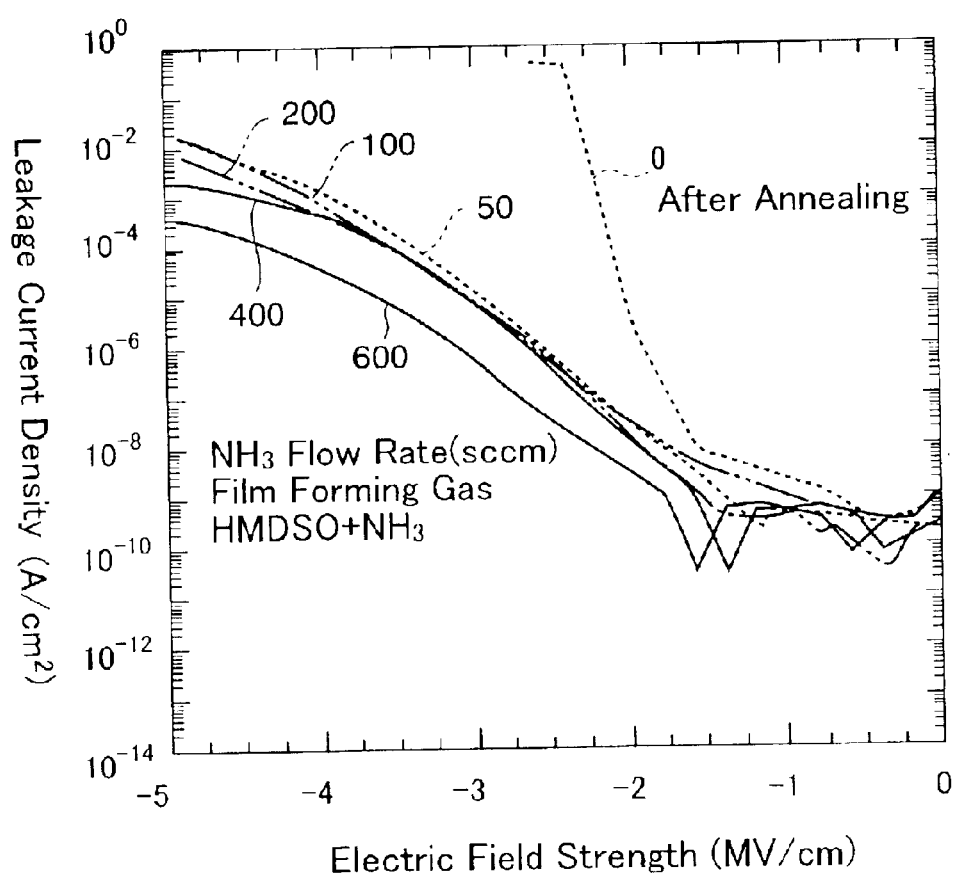
FIG. 5 is a graph of leakage current density versus electric field strength for another first barrier insulating film according to the first embodiment of the present invention.
Figure 8:
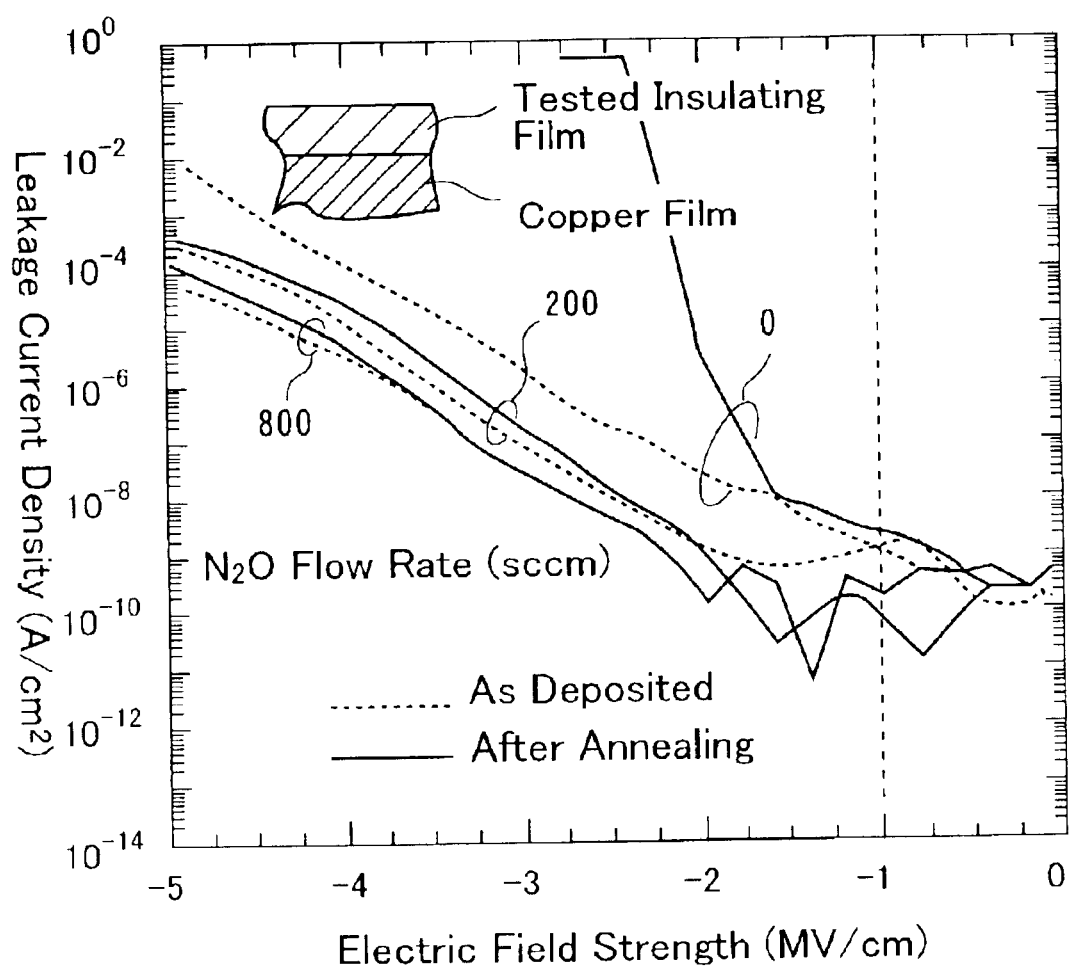
FIG. 8 is a graph of the leakage current density versus electric field strength for the second barrier insulating film according to the first embodiment of the present invention.

As shown in FIG. 3, the leakage current density has little dependency on the $NH_3$ flow rate, except for the sample that was measured at a $NH_3$ flow rate of 600 sccm as the first film-forming gas. The leakage current density increased, except for the sample which was formed with a $NH_3$ flow rate of 600 sccm, as the electric field strength was increased in the negative direction, and was $10^{-6}$ to $10^{-5}$ $A/cm^2$ at $-5$ MV/cm. This leakage current density was smaller than that of the tested insulating film that is shown in FIG. 5 and contains nitrogen and smaller than that of the tested insulating film that is shown in FIG. 8 and does not contain nitrogen, as described later.

Where the $NH_3$ flow rate was 600 sccm, an abrupt increase of the leakage current density appeared at an electric field strength of $-5$ MV/cm, representing dielectric breakdown of the insulating film. Considering the dielectric breakdown characteristics of other samples in FIG. 3 together, it is difficult to attribute the dielectric breakdown to copper diffusion. This dielectric breakdown may be considered as due to defects, etc. of the insulating film.

(c) The Copper Diffusion Preventing Capability of the Tested Insulating Film

Figure 4:
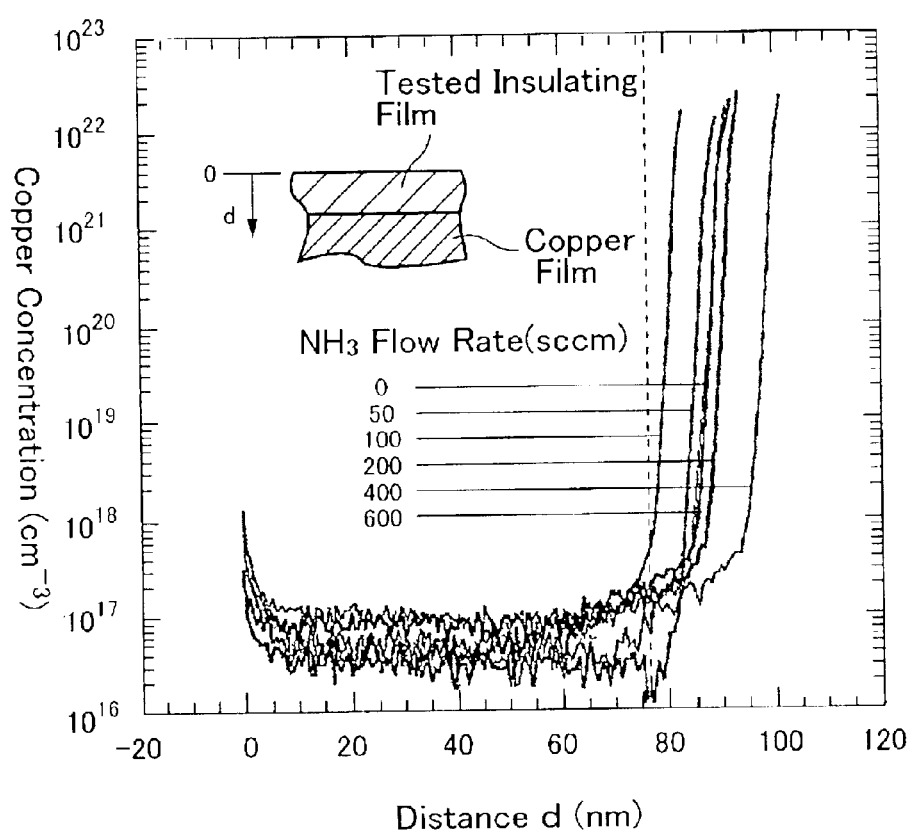
FIG. 4 is a graph of copper concentration (diffusion preventing capability) versus distance d for the first barrier insulating film according to the first embodiment of the present invention.

FIG. 4 is a graph showing results of testing of the copper diffusion preventing capability of the insulating films. The $NH_3$ flow rates of 0, 50, 100, 200, 400, and 600 of the first film-forming gas were used as the variable parameter. The ordinate denotes copper density ($cm^{-3}$) on a linear scale, and the abscissa denotes a distance d (nm) measured from the surface of the tested insulating film in the direction of the copper film on a linear scale.

The insulating film to be tested was formed on the copper film. A dotted line shows the boundary surface in FIG. 4. The copper diffusion preventing capability of the tested insulating film was evaluated by measuring the copper density in the tested insulating film after the annealing explained above.

As shown in FIG. 4, no copper was found to have diffused into the tested insulating film. It was found that, as was expected, the tested insulating film had sufficiently high diffusion preventing capability with respect to the copper.

Next, test results for another first barrier insulating film (tested insulating film) will be explained. The plasma enhanced surface treatment conditions and the annealing conditions were set identically to the above conditions, and the film-forming conditions were set as follows. In contrast to the film-forming conditions 1, no $N_2O$ was added to the film-forming gas.

Film-forming conditions 1a:
(a) First film-forming gas
   HMDSO flow rate: 50 sccm
   $NH_3$ flow rate (parameter): 0, 50, 100, 200, 400, 600 sccm
   Gas pressure (parameter): 1 Torr
(b) Plasma exciting conditions
   Lower electrode: low frequency power (frequency 380 kHz)=150 W (0.36 $W/cm^2$)
   Upper electrode: high frequency power (frequency 13.56 MHz)=0 W
(c) Substrate heating condition: 375° C.

(a) The Leakage Current of the Tested Insulating Film

FIG. 5 is a graph showing the relationship between the electric field strength applied to the tested insulating film and the leakage current density of the tested insulating film after annealing. The ordinate gives the leakage current density ($A/cm^2$) of the tested insulating film on a linear scale, and the abscissa gives the electric field strength (MV/cm) on a linear scale. The $NH_3$ flow rate of the first film-forming gas was used as the variable parameter.

The insulating film to be tested was formed on the copper film. After the annealing was carried out under the above annealing conditions, the copper film was grounded and then the mercury probe was brought into contact with the surface of the insulating film to be tested. Then, the leakage current was measured by applying a negative voltage to the mercury probe, and the leakage current density was calculated based on the area of the mercury probe. The electric field strength (abscissa) was the electric field strength obtained based on the negative voltage at that time. A minus sign for the electric field strength indicates that the electric field was directed from the copper film to the mercury probe.

As shown in FIG. 5, the sample formed when the $NH_3$ flow rate of the first film-forming gas was 0 sccm exhibited dielectric breakdown. It may be considered that this breakdown was caused by diffusion of the copper. The other insulating films formed by using the film-forming gas containing $NH_3$ did not show dielectric breakdown.

In this case, the value of the leakage current showed little dependency on the $NH_3$ flow rate. The leakage current density increased as the electric filed strength was increased in the negative direction, and was $10^{-4}$ to $10^{-2}$ $A/cm^{-2}$ when the electric field strength was $-5$ MV/cm. This leakage current density was almost the same level as that of the second barrier insulating film that is described later and does not contain nitrogen.

(b) The copper Diffusion Preventing Capability of the Tested Insulating Film

Figure 6:
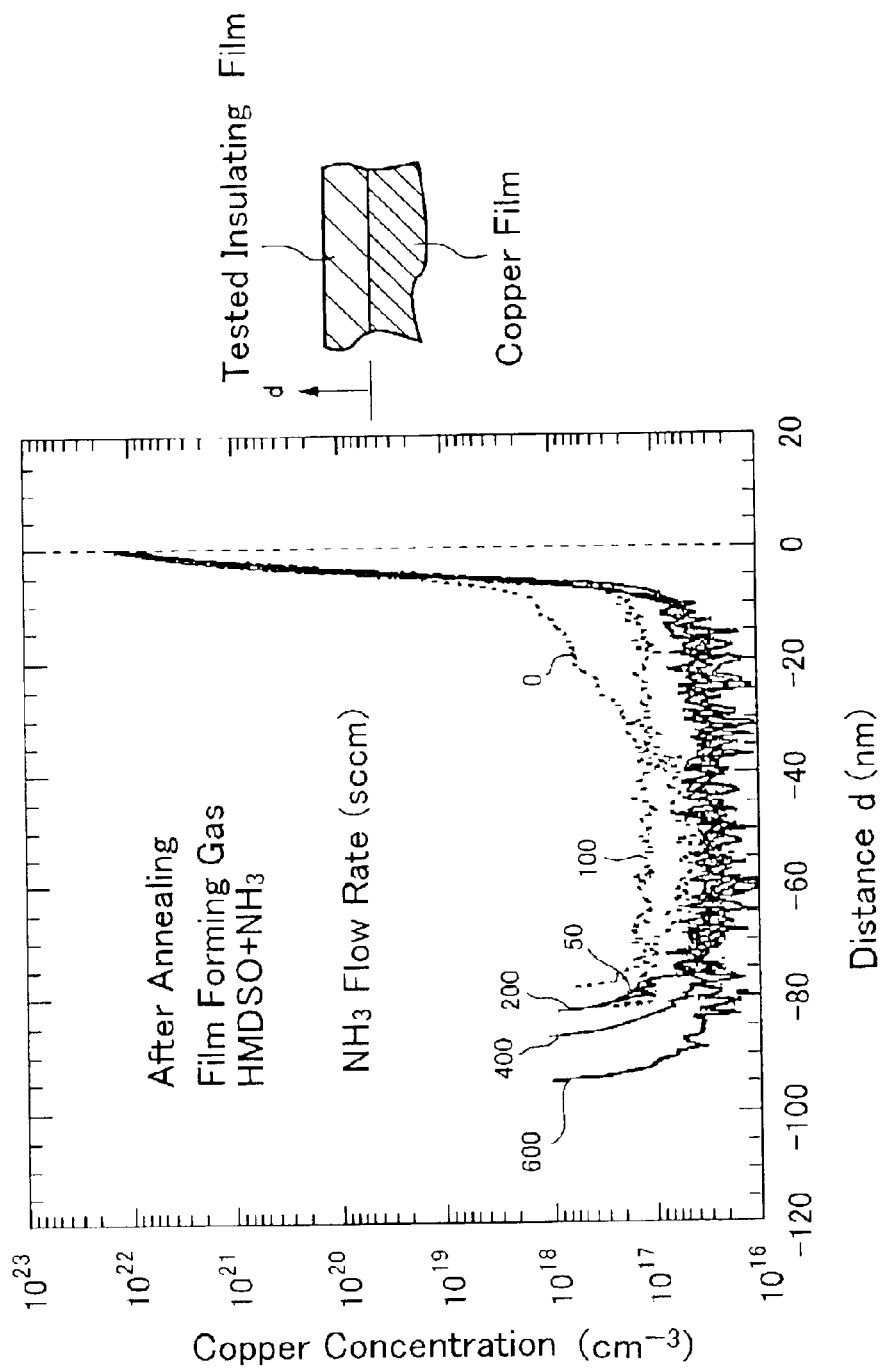
FIG. 6 is a graph of copper concentration (diffusion preventing capability) versus distance d for another first barrier insulating film according to the first embodiment of the present invention.

FIG. 6 is a graph showing test results for the copper diffusion preventing capability of the tested insulating film after the annealing. The $NH_3$ flow rate of the first film-forming gas was used as the variable parameter. The ordinate denotes the copper concentration ($cm^{-3}$) on a logarithmic scale, and the abscissa denotes the distance d (nm) measured from the surface of the tested insulating film in the direction of the copper film on a linear scale.

The insulating film to be tested was formed on the copper film. In FIG. 6, a vertical dotted line indicates the boundary between the films. The copper diffusion preventing capability of the tested insulating film was evaluated by measuring the copper concentration in the tested insulating film after the annealing explained above.

As shown in FIG. 6, it was found that, when the $NH_3$ flow rate was 0 sccm, i.e., $NH_3$ was not added, copper diffused into the tested insulating film.

Next, test results for the second barrier insulating film (tested insulating film) will be explained. The plasma surface treatment conditions and the annealing conditions were set identically to the above conditions, and the film-forming conditions were set as follows.

Film-forming conditions 2:
(a) Second film-forming gas
   HMDSO flow rate: 50 sccm
   $N_2O$ flow rate (parameter): 0, 50, 200, 400, 800 sccm
   Gas pressure (parameter): 1 Torr
(b) Plasma exciting conditions
   Lower electrode: low frequency power (frequency 380 kHz)=150 W (0.36 $W/cm^2$)
   Upper electrode: high frequency power (frequency 13.56 MHz)=0 W
(c) Substrate heating condition: 375° C.

(a) The Relative Dielectric Constant and the Refractive Index of the Tested Insulating Film FIG. 7 is a graph showing relationships between relative dielectric constant and the refractive index of the film formed on the Si substrate and the $N_2O$ flow rate of the second film-forming gas. The ordinate on the left side denotes the relative dielectric constant of the tested insulating film on a linear scale, the ordinate on the right side denotes the refractive index of the tested insulating film on a linear scale, and the abscissa denotes the $N_2O$ flow rate of the second film-forming gas on a linear scale.

Insulating films to be tested were formed on the Si substrate with the $N_2O$ flow rate set to 0, 50, 200, 400 and 800 sccm respectively, without application of high frequency power to the upper electrode 2. The relative dielectric constant was measured in the following manner. That is, the mercury probe was brought into contact with a surface of the insulating film to be tested, then the DC bias voltage was applied between the mercury probe and the Si substrate, and then the signal of the frequency 1 MHz was superimposed, to obtain the C-V measurement. The measured relative dielectric constant is indicated by the ● mark in FIG. 7. Also, the refractive index was measured with an ellipsometer using a He—Ne laser having a wavelength of 6338 Angstrom. The measured refractive index is indicated by a ○ mark in FIG. 7.

As shown in FIG. 7, the relative dielectric constant gradually increased with increase of the $N_2O$ flow rate. The relative dielectric constant, that was about 3.9 when the $N_2O$ flow rate was 0 sccm, became about 4.1 when the $N_2O$ flow rate was 800 sccm.

The refractive index abruptly decreased with increase of the $N_2O$ flow rate of 0 sccm to 50 sccm, and then gradually decreased with the increase of the $N_2O$ flow rate. The refractive index that was about 1.76 when the $N_2O$ flow rate was 0 sccm became about 1.68 when the $N_2O$ flow rate was 50 sccm and also became about 1.62 when the $N_2O$ flow rate was 800 sccm. As explained in connection with the test results for the first barrier insulating film, the foregoing facts show that the first barrier insulating film containing nitrogen is denser.

(b) The Leakage Current of the Tested Insulating Film

FIG. 8 is a graph showing the relationship between the electric field strength applied to the tested insulating film and the leakage current density of the tested insulating film before and after annealing. The ordinate denotes the leakage current density ($A/cm^2$) of the tested insulating film on a logarithmic scale, and the abscissa denotes the electric field strength (MV/cm) on a linear scale. $N_2O$ flow rates of 0, 200, and 800 sccm of the second film-forming gas were used as the variable parameter.

The insulating film to be tested was formed on the copper film. The copper film was grounded immediately after the film formation but before the annealing and after the annealing, and then the mercury probe was brought into contact with the surface of the insulating film to be tested, the leakage current was measured by applying the negative voltage to the mercury probe, and then the leakage current density was calculated based on the area of the mercury probe. The electric field strength (abscissa) is the electric field strength obtained based on the negative voltage at that time. A minus sign for the electric field strength signifies that the electric field was directed from the copper film to the mercury probe.

As shown in FIG. 8, in the sample formed when the $N_2O$ flow rate of the second film-forming gas was 0 sccm, the leakage current abruptly increased in the low electric field, indicating dielectric breakdown due to diffusion of copper after the annealing. The other insulating films formed by the film-forming gas containing $N_2O$ did not show breakdown.

Thus, the leakage current density showed little dependency on the $N_2O$ flow rate, except for the sample formed with a $N_2O$ flow rate 0 sccm of the second film-forming gas. The leakage current density increased as the electric field strength was increased in the negative direction, and was $10^{-5}$ to $10^{-4}$ $A/cm^2$ at −5 MV/cm. This leakage current density was larger than that of the first barrier insulating film described in connection with FIG. 3 and contains nitrogen.

(c) The Copper Diffusion Preventing Capability of the Tested Insulating Film

Figure 9:
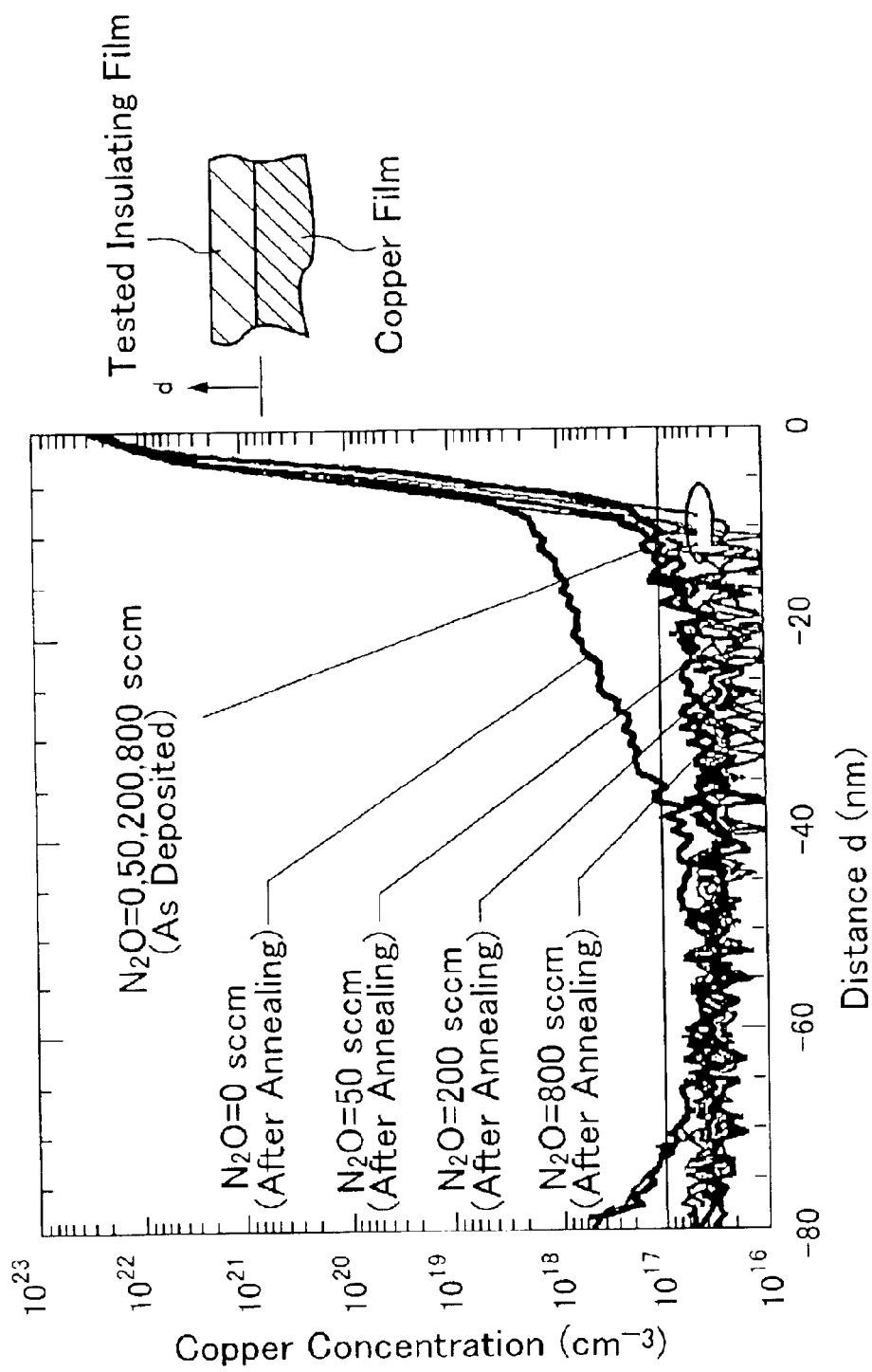
FIG. 9 is a graph showing copper concentration (diffusion preventing capability) versus distance d of the second barrier insulating film according to the first embodiment of the present invention.

FIG. 9 is a graph showing test results for the copper diffusion preventing capability of the tested insulating film before and after the annealing. The $N_2O$ flow rate of the second film-forming gas was used as the variable parameter. The ordinate denotes the copper concentration ($cm^{-3}$) on a logarithmic scale, and the abscissa denotes the distance d (nm) measured from the surface of the tested insulating film in the direction of the copper film on a linear scale.

The insulating film to be tested was formed on the copper film. The dotted line in FIG. 9 shows the boundary surface. The copper diffusion preventing capability of the tested insulating film was evaluated by measuring the copper concentration in the tested insulating film, immediately after the film formation prior to and after the annealing.

As shown in FIG. 9, it was found that, when the $N_2O$ flow rate was 0 sccm, i.e., no $N_2O$ was added, the copper diffused into the tested insulating film. In this case, the diffusion of copper was not determined for the sample prepared with $N_2O$.

As described above, according to the first embodiment of the present invention, it was found that the insulating film containing Si, O, H, N and C is dense and its relative dielectric constant is relatively high because the film contains nitrogen, and its leakage current was low.

Also, the insulating film containing Si, O, H and C has a low dielectric constant, a relatively low density, and a relatively large leakage current.

Both the insulating film formed by using the first film-forming gas 1a or 1 and the insulating film formed by using the second film-forming gas 2 containing $N_2O$ have excellent copper diffusion preventing capability. Thus, no clear difference between them is apparent.

According to the total evaluation, the insulating film containing Si, O, H, N and C is excellent in denseness, and therefore such film is suitable for use as the first barrier insulating film. The insulating film containing Si, O, H and C has proven to be suitable for use as the second barrier insulating film.

As described above, a structure of two or more layers, inclusive of at least the first and second barrier insulating films, is employed as the barrier insulating film. In order to provide low leakage current and high copper diffusion preventing capability, the first barrier insulating film that has the relatively high relative dielectric constant is formed as a thin film thickness, while the second barrier insulating film that has the low relative dielectric constant is formed as a sufficiently thick film to provide the thickness that is necessary for the overall barrier insulating film. As a result, the overall barrier insulating film has a low relative dielectric constant, low leakage current, and sufficiently high copper diffusion preventing capability.

While the present invention has been explained in detail with reference to the first embodiment, the scope of the present invention is not limited to the above embodiment. Variations of the above embodiment not departing from the gist of the present invention are included within the spirit of the present invention.

For example, in the above first embodiment, as the first film-forming gas to form the insulating film containing Si, O, H, N and C, HMDSO+$N_2$O+$NH_3$ or HMDSO+$NH_3$ is employed. However, another silicon containing gas, e.g., OMCTS or TMCTS may be employed in place of HMDSO. Also, any methylsilane mentioned above (item ii) may be employed in place of siloxane. In addition, as the oxygen containing gas, $H_2O$ or $CO_2$ mentioned above (item iii) may be employed in place of $N_2O$. As the nitrogen containing gas, $N_2$ may be employed in place of $NH_3$. That is, as the first film-forming gas, various combinations of the above-mentioned silicon containing gases, the oxygen containing gas, and the nitrogen containing gas or various combinations of the silicon containing gas and the nitrogen containing gas may be employed.

Further, while the second film-forming gas used to form the insulating film containing Si, O, H and C, is described above as HMDSO+$N_2O$, another siloxane, e.g., OMCTS or TMCTS may be employed in place of HMDSO. Also, any methylsilane mentioned above (item ii) may be employed in place of siloxane. In addition, $H_2O$ or $CO_2$ may be employed as the oxygen containing gas in place of $N_2O$. Therefore, as the second film-forming gas, combinations of the silicon containing gas selected from those gases and the oxygen containing gas may be employed.

In forming the first barrier insulating film, silane ($SiH_4$) may be employed instead of HMDSO, one of $N_2O$ and $H_2O$ may be employed as the oxygen containing gas, and one of $N_2$ and $NH_3$ may be employed as the nitrogen containing gas.

In forming the second barrier insulating film, containing Si, O and H, silane ($SiH_4$) may be employed instead of HMDSO, and one of $N_2O$ and $H_2O$ may be employed as the oxygen containing gas.

Second Embodiment

Figure 10A:
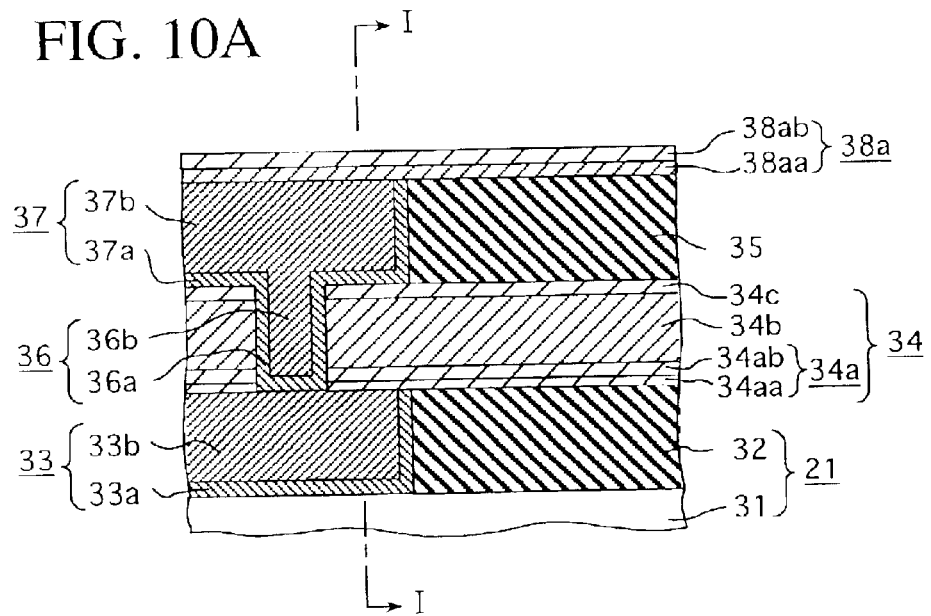
FIGS. 10A and 10B are sectional views showing a semiconductor device produced by the manufacturing method according to a second embodiment of the present invention.
Figure 10B:
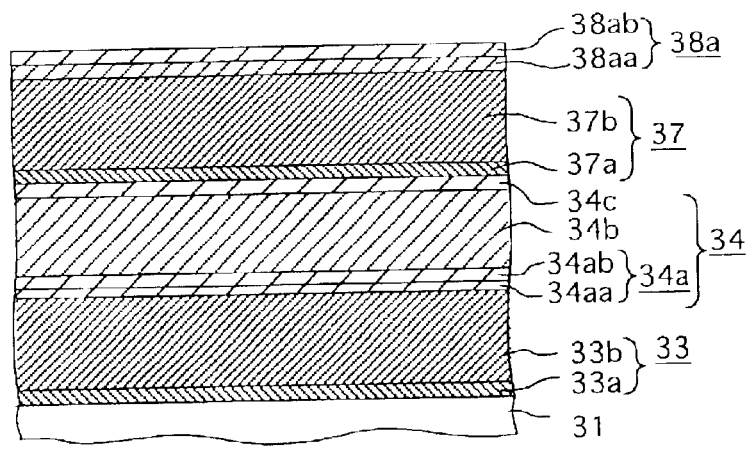

FIG. 10A is a sectional view showing a semiconductor device in accordance with a second embodiment of the present invention. FIG. 10B is a sectional view taken along line I—I in FIG. 10A.

As shown in FIGS. 10A and 10B, the manufacturing method of the present invention is applied to form a barrier insulating film 34a, which covers the lower wiring consisting mainly of the copper film, included in an interlayer insulating film 34 containing barrier insulating films 34a, 34c, and to a barrier insulating film 38a, which covers the upper wiring consisting mainly of the copper film.

First, a wiring-burying insulating film 32 made of an $SiO_2$ film or an SiOCH film having a film thickness of about 1 μm is formed on a semiconductor substrate 31. In this case, the SiOCH film is an insulating film that contains Si, O, C and H.

Then, a wiring recess is formed by etching the wiring-burying insulating film 32, and then a TaN film 33a is formed as the copper diffusion preventing film on an inner surface of the wiring recess. Then, a copper seed layer (not shown) is formed on a surface of the TaN film 33a by the sputter method, and then the copper film 33b is formed by plating. The resultant surface is planarized by polishing the copper film 33b and the TaN film 33a, both projecting from the wiring recess, by CMP (Chemical Mechanical Polishing). Accordingly, the lower wiring consisting of the copper film 33b and the TaN film 33a, together with the semiconductor substrate 31, form a substrate 21.

Then, a barrier insulating film 34a that comes into contact with the copper film 33b is formed by plasma enhanced CVD as follows.

First, the surface of the substrate 21 is subjected to plasma processing before the barrier insulating film 34a is formed. The process gas conditions are set the same as the conditions used in the first embodiment.

More particularly, the substrate 21 is introduced into the chamber 1 of the film-forming apparatus 101 and held on the substrate holder 3. Then, the substrate 21 is heated and maintained at a temperature of 375° C. Then, the process gas is introduced into the chamber 1 and the gas pressure is maintained at 1 Torr. Then, a high frequency power of 400 W (0.963 W/cm$^2$) is applied to the upper electrode. Low frequency power is not applied to the lower electrode. The process gas is thereby plasmanized and the natural oxide film on the surface of the copper film 33b is removed by keeping this state for a predetermined time.

Then, in order to form the barrier insulating film 34a, the substrate temperature is held at 375° C. The HMDSO gas, the $N_2O$ gas, and the $NH_3$ gas are introduced into the chamber 1 of the plasma enhanced film-forming apparatus 101 shown in FIG. 1 at the flow rates of about 50 sccm, about 200 sccm, and about 50 sccm, respectively, to maintain the pressure at 1 Torr.

Then, low frequency power of about 150 W (0.36 W/cm$^2$) at a frequency of 380 kHz is applied to the lower electrode 3, High frequency power is not applied to the upper electrode 2. As a result, HMDSO, $N_2O$, and $NH_3$ are plasmanized and this state is maintained for 10 seconds to form the first barrier insulating film 34aa made of an PE-CVD $SiO_2$ film, which contains Si, O, H, N and C and has a film thickness of 20 nm.

While maintaining the substrate temperature at 375° C., the HMDSO gas and the $N_2O$ gas are introduced at flow rates of about 50 sccm and about 200 sccm, respectively, to maintain the pressure at 1 Torr.

Then, low frequency power of about 150 W (0.36 W/cm$^2$) at a frequency of 380 kHz is applied to the lower electrode 3. High frequency power is not applied to the upper electrode 2.

As a result, HMDSO and $N_2O$ are plasmanized and then this state is maintained for 10 seconds to form the second barrier insulating film 34ab as a PE-CVD $SiO_2$ film, which contains Si, O, H, N and C and has a film thickness of 20 nm.

The result of the above procedures is formation of a barrier insulating film 34a consisting of the first barrier insulating film 34aa and the second barrier insulating film 34ab.

Then, an interlayer insulating film 34 is formed by forming sequentially the insulating film 34b and the barrier insulating film 34c on the barrier insulating film 34a by the normal well-known method.

Then, a wiring-burying insulating film 35, i.e. a $SiO_2$ film or a SiOCH film of about 1 μm in thickness, is formed by the same method that is used to form the $SiO_2$ film or the SiOCH film on the interlayer insulating film 34.

Then, a connecting conductor 36 consisting mainly of copper film and an upper wiring 37 consisting mainly of copper film are formed by the well-known dual damascene method. In FIGS. 10A and 10B, symbols 36a, 37a indicate TaN films and symbols 36b, 37b indicate copper films.

Then, a barrier insulating film 38a consisting of a first barrier insulating film 38aa and a second barrier insulating film 38ab is formed on the overall surface under the same film-forming conditions as used in forming the barrier insulating films 34aa and 34ab to complete the semiconductor device.

As described above, according to the second embodiment, $NH_3$ of the film-forming gas is introduced in the former half and is stopped in the latter half to form the double-layered barrier insulating films 34a, 38a that, as a whole, have low leakage current, sufficiently high copper diffusion preventing capability, and low relative dielectric constant.

As a consequence, if the barrier insulating films 34a, 38a are interposed between the copper wirings 33, 37 as a part of the interlayer insulating film, a semiconductor device that can provide high speed signal transmission with high reliability is obtained.

While the present invention has been explained in detail with reference to the second embodiment, the scope of the present invention is not limited to the second embodiment. Variations of the second embodiment which do not depart from the gist of the present invention are considered to be contained within the spirit of the present invention.

For example, while the second embodiment is described as a double-layered structure that consists of the first barrier insulating films 34aa, 38aa containing nitrogen and the second barrier insulating films 34ab, 38ab not containing nitrogen, the second embodiment is also applicable to a a structure of three or more layers, including at least the first barrier insulating films 34aa, 38aa containing nitrogen and the second barrier insulating films 34ab, 38ab not containing nitrogen.

Also, the first barrier insulating films 34aa, 38aa containing nitrogen are formed in contact with the copper wiring, while the second barrier insulating films 34ab, 38ab not containing nitrogen are formed on the first barrier insulating films 34aa, 38aa. In this case, the opposite arrangement may be employed.

Moreover, though the second embodiment is described as having barrier insulating film 34c formed on the insulating film 34b, the barrier insulating film 34c may be omitted to form the wiring 37 directly on the insulating film 34b having a low relative dielectric constant.

As described, the present invention provides a structure having two or more layers including at least the first barrier insulating film containing nitrogen, that provides copper diffusion preventing capability, etc. since such film has high denseness with a relatively higher relative dielectric constant, and the second barrier insulating film not containing nitrogen, while not preventing copper diffusion, etc., since such film is slightly lower in denseness, has a lower relative dielectric constant.

The double-layered structures, wherein the respective barrier insulating films mutually complement each other, give a barrier insulating film which, as a whole, has low leakage current, sufficiently high copper diffusion preventing capability, and a low relative dielectric constant.

In particular, if this barrier insulating film is interposed between the copper wirings as a part of the interlayer insulating film, there can be obtained a semiconductor device providing high speed signal transmission and having high reliability.

What is claimed is:

1. A semiconductor device having a barrier insulating film covering a first wiring layer of a copper film or consisting mainly of the copper film on a substrate, the composite barrier insulating film comprising:

at least two layers including a first barrier insulating film formed on and covering said first wiring layer, said first barrier insulating film consisting of silicon, oxygen, nitrogen and hydrogen or silicon, oxygen, nitrogen, hydrogen and carbon, and a second barrier insulating film formed on and covering said first barrier insulating film, said second barrier insulating film consisting of silicon, oxygen and hydrogen or silicon, oxygen, hydrogen and carbon; and a $SiO_2$ insulating film having a low dielectric constant formed on the composite barrier insulating film; and wherein the composite barrier insulating film and the insulating film having the low dielectric constant constitute an interlayer insulating film, and a second wiring layer of a copper film or consisting mainly of a copper film is formed on the insulating film having the low dielectric constant.

\* \* \* \* \*